United States Patent [19]

Nitta

[11] Patent Number: 5,445,692
[45] Date of Patent: Aug. 29, 1995

[54] PROCESS FOR REINFORCING A SEMICONDUCTOR WAFER

[75] Inventor: Toshiyuki Nitta, Konohana, Japan

[73] Assignee: Sumitomo ELectric Industries, Ltd., Osaka, Japan

[21] Appl. No.: 156,920

[22] Filed: Nov. 24, 1993

[30] Foreign Application Priority Data

Nov. 26, 1992 [JP] Japan ................... 4-317388
May 19, 1993 [JP] Japan ................... 5-117173
Sep. 7, 1993 [JP] Japan ................... 5-222459

[51] Int. Cl.6 ............................................. B32B 31/20
[52] U.S. Cl. ............................................. 156/87; 156/286
[58] Field of Search ................ 156/87, 286, 153, 154; 51/277; 29/25.01; 437/225; 451/41, 54, 439, 364, DIG. 914

[56] References Cited

U.S. PATENT DOCUMENTS 4,283,242  8/1981  Regler et al. ............... 156/286
4,316,757  2/1982  Walsh .......................... 156/286
5,256,599  10/1993 Asetta et al. ................. 51/277

FOREIGN PATENT DOCUMENTS 2384589  10/1978  France .
54-098568  8/1979  Japan .
55-098877  7/1980  Japan .
55-140817  11/1980  Japan .
62-001242  1/1987  Japan .
63-073638  4/1988  Japan .
63-198351  8/1988  Japan .
1228748  9/1989  Japan .
3005930  1/1991  Japan .
2099742  12/1982  United Kingdom .

Primary Examiner—Michael W. Ball
Assistant Examiner—Richard Crispino
Attorney, Agent, or Firm—Cushman, Darby & Cushman

[57] ABSTRACT

A process is used for reinforcing a semiconductor wafer, where remaining bubbles in a hot-melt adhesive can be reduced in number and in size. A reinforced wafer adhering to a reinforcing plate with a heated and softened adhesive is kept in a lower ambient pressure than a standard atmosphere for a predetermined period for deaeration, and is cooled under a higher pressure than the deaeration pressure. A reinforcing plate has a groove on its adhering face.

12 Claims, 8 Drawing Sheets

PROCESS FOR REINFORCING A SEMICONDUCTOR WAFER

BACKGROUND OF THE INVENTION

1. Field of The Invention

The present invention relates to a process for reinforcing a semiconductor wafer in which a reinforcing member is adhered to the wafer with an adhesive, and particularly to a process for reinforcing a semiconductor wafer in which the adhesive is a hot-melt type and deaerated under a vacuum or reduced pressure conditions.

2. Related Background Art

A semiconductor wafer sliced off from a semiconductor crystal ingot is chemically or mechanically ground to be mirror-polished. Afterward, luminescent diodes, transistors and the like are formed on one of the faces of the wafer (i.e., the device-formed face) by an ordinary process, and then the wafer may sometimes be made thinner by grinding another face chemically or mechanically. Before applying the process, the wafer is reinforced or mechanically strengthened by making a reinforcing plate adhere to the device-formed face with a hot-melt adhesive.

It is important that no gas bubbles are included in the adhesive in this process of adherence of a reinforcing plate. The inclusion of bubbles causes the following troubles especially when the semiconductor wafer is thin and of a brittle material (for example, InP, GaAs and the like). First, gas bubbles in the hardened adhesive expand due to being heated as the wafer adhering to the reinforcing plate is ground by a grindstone. An expansion of the bubbles causes that part of the semiconductor wafer to bulge, and consequently that part is over-ground and the thickness may be uneven. A drawback brought about is that every semiconductor chip made through a following dicing process has a different thickness from each other. Second, gas bubbles expand as the wafer is treated in a vacuum vessel after it is adhered to a reinforcing plate and ground thinner, especially when the treatment accompanies heating. In that event, the wafer itself may be broken due to a local stress exerted by the expansion of the bubbles. The probability of the wafer being broken is high, especially when the part was over-ground to be thinner at a location of a bubble.

As an example of a technology to avoid this type of problem, there is one described in Japanese laid open Application No. 2-123726 by HAYASE et al. They propose that the ambient pressure be lowered to a vacuum before a semiconductor wafer is adhered closely to a reinforcing plate with an adhesive. With such a technology, even if some gas bubbles remain in the hardened adhesive between the wafer and the reinforcing plate which are closely in contact with each other, pressure in the bubbles is relatively low and an amount of expansion of the bubbles due to heating is relatively small, which little deforms the wafer locally. When a weight pushes down the reinforcing plate to the wafer, the lower the viscosity of the liquid adhesive is, the more easily the bubbles move in the adhesive, and consequently bubbles left in the hardened adhesive are small and few.

However, it is impossible to make the viscosity of an adhesive sufficiently low. Additionally, generation of a certain amount of bubbles cannot be avoided although the pressure in the bubbles is low. As a wafer is thinner, expansion of the bubbles deforms the wafer more, which makes the probability of breakage high. This problem occurs more easily especially when a reinforced wafer is exposed to a vacuum and to high temperature conditions during a following step. Additionally, if a reinforced semiconductor wafer is put in a wet treatment such as a rinse process, a rinsing liquid or etching liquid invades the bubbles, and the device-formed face is contaminated.

It is an object of the present invention to provide a process for reinforcing a semiconductor wafer in which the number of remaining or residual bubbles in a hot-melt adhesive can be reduced.

It is another object of the present invention to provide a process for reinforcing a semiconductor wafer in which a volume of each of the remaining or residual bubbles in a hot-melt adhesive can be reduced.

It is still another object of the present invention to provide a reinforced semiconductor wafer which does not develop a defective part even during a treatment under a vacuum, under heating, and under a dipping treatment in a liquid.

SUMMARY OF THE INVENTION

A process for reinforcing a semiconductor wafer of the present invention comprises the steps of first reinforcing the semiconductor wafer by adhering the semiconductor to a reinforcing member having a flat face using a hot-melt adhesive softened by heating, deaerating the hot-melt adhesive by leaving the reinforced semiconductor wafer in an ambience of lower pressure than atmospheric pressure for a predetermined period of time as the hot-melt adhesive is softened, and hardening the hot-melt adhesive by cooling the reinforced semiconductor wafer under a higher pressure than the pressure of the ambience of the step of deaerating.

According to the present invention, the number of remaining or residual bubbles in a hardened hot-melt adhesive can be sufficiently reduced by implementing deaeration under a low pressure condition.

Additionally, the adhesive hardening is done under a higher pressure than the pressure for the deaeration, the volume of each of the remaining or residual bubbles, although the number of the remaining bubbles is small, can be reduced as being proportional to the pressure difference between deaeration and hardening. Furthermore, volatile elements in the bubbles generated during the deaeration treatment under a low pressure can be re-absorbed in the hot-melt adhesive during the hardening treatment under a higher pressure and the volume of the bubbles is reduced further.

A feature of the present invention resides in giving a different pressure from the deaerating treatment to hardening treatment, which is described in more detail hereinafter.

There are two different manners of making a semiconductor wafer adhere to a reinforcing plate with a hot-melt adhesive softened by heating, one of which is to be performed under atmospheric pressure, and another is to be perform under a reduced pressure. In the former manner, applying a hot-melt adhesive to a reinforcing plate is easier, and setting of a weight for applying pressure to the wafer placed on the reinforcing plate is also easier. In the latter manner, volatile elements or air can be eliminated from the liquid adhesive before making the wafer adhere to the reinforcing plate because the wafer is placed on the reinforcing plate under a low pressure, and accordingly the number of remaining bubbles in the hardened adhesive can be further reduced and also the size of the resulting bubbles is smaller.

Next, there are three ways described as follows, how a reinforcing plate and a wafer are firmly made to adhere to each other with a hot-melt adhesive. First, a hard hot-melt adhesive is rubbed on a heated reinforcing plate. This treatment leads a surface of the reinforcing plate to be wet with softened and liquified adhesive, and then a wafer is placed on it. Second, a reinforcing plate with a hot-melt adhesive is prepared in advance, where the liquified adhesive is applied on a surface of the reinforcing plate, and then cooled until hardened. A semiconductor wafer is placed on the hardened adhesive, and the adhered wafer and plate are placed on a hot plate to be heated. Third, a hardened hot-melt adhesive formed as a thin film is inserted between a semiconductor wafer and a reinforcing plate, and the adhered wafer and plate are placed on a hot plate to be heated.

A preferable pressure difference between a deaeration treatment and a hardening treatment depends on viscosity of an adhesive, and strength and thickness of a semiconductor wafer. Generally, when a semiconductor wafer is reinforced, a pressure for deaeration may be about one fifth that for hardening, but preferably about one tenth. A pressure for a hardening treatment may be of atmospheric pressure, but a low pressure such as 60–250 mm Hg is preferable where a heating step is included in a following process. According to experiment, little problem was caused when deaeration was conducted under 10 mm Hg and hardening was conducted under 100 mm Hg.

A period of time for cooling and hardening under a higher pressure may be preferably shorter than a period of time for deaeration under a lower pressure. If a period of time for hardening is too long, during the hardening treatment the hot-melt adhesive re-absorbs gases released from the liquified adhesive during a deaeration treatment, that is, volatile elements in the hot-melt adhesive or air. According to our study, a period of time for hardening is preferably to be shorter than about one tenth that for deaeration. Cooling for hardening may be done naturally merely by stopping heating, or alternatively the hot plate may be forcibly cooled by supplying refrigerant where there is a large heat capacity of the reinforcing plate structure for the semiconductor wafer and the hot plate. A common hot plate generally used has a built-in heater inside of it, is heated by turning on the heater, and is naturally cooled by turning off the heater. Where a forced cooling is necessary, either the hot plate may be mounted on a cooling apparatus, or the plate may be mounted on an apparatus having both functions of heating and cooling.

A material of a reinforcing plate should preferably have approximately the same thermal expansion coefficient as that of a semiconductor wafer material. For example, where a semiconductor wafer is of InP, borosilicate glass is appropriate for a reinforcing plate. A hot-melt adhesive is a composite of thermoplastic macromolecule resins as main components, and is liquified by heating and hardened by cooling. For example, among them are such resins as those in family lines of ethylene vinyl acetate resin, polyamide resin, polyester resin and the like.

A process for reinforcing a semiconductor wafer according to the present invention comprises the steps of first reinforcing the semiconductor wafer by adhering the semiconductor to a reinforcing member having a flat face and a groove formed thereon, using a hot-melt adhesive softened by heating, deaerating the hot-melt adhesive by exposing the reinforced semiconductor wafer in an ambient atmosphere of lower pressure than standard atmospheric pressure for a predetermined period of time as the hot-melt adhesive is softened, wherein the deaeration is conducted through the groove, and hardening the hot-melt adhesive by cooling the reinforced semiconductor wafer.

According to the present invention, since a groove is formed on a reinforcing plate as one of the examples of a reinforcing member, bubbles in a liquid adhesive enter the groove during a deaeration process under a low pressure and shift through the groove to leave. Accordingly, deaeration is conducted effectively, and consequently the number of bubbles remaining in the hardened adhesive can be reduced. This is described in more detail as follows. Bubbles made of air remaining in a hot-melt adhesive softened like a liquid, and volatilized gases from the adhesive, shift in the adhesive which is sandwiched between a semiconductor wafer and a reinforcing plate, and these bubbles are released from an edge of an adhering face to be deaerated. In this event, insufficient fluidity of the liquid adhesive will prevent the bubbles from shifting easily. Here, the resistance to flow or the extent of fluidity depends on viscosity of the liquid adhesive and a clearance between the semiconductor wafer and the reinforcing plate. In the present invention, a clearance between the wafer and the reinforcing plate is partially enlarged by forming a groove on the reinforcing plate, which makes the bubbles shift more easily. A preferable size of the groove formed on the reinforcing plate depends on the size of bubbles in the liquid adhesive, but a sufficient size may be at least 10 $\mu$m deep and at least 100 $\mu$m wide where an ordinary hot-melt adhesive is used. According to the present invention, wherein a groove is formed on a reinforcing plate, bubbles can be sufficiently prevented from remaining even if a deaeration treatment is performed under the same pressure as that for the hardening treatment. However, if a deaeration treatment is done under a lower pressure than that for the hardening treatment, the remaining bubbles can be fewer.

A reinforced semiconductor wafer according to the present invention comprises a reinforcing member having a flat face and a semiconductor wafer adhering to the reinforcing member with a hot-melt adhesive, wherein a groove extending to an outside of an adhering face between the semiconductor wafer and the flat face or a vicinity of an edge of the adhering face is formed on the flat face.

According to the present invention, even if some bubbles remain in a hardened adhesive, most of the bubbles exist in a groove formed on a reinforcing groove. Therefore, contact area of the bubbles with a semiconductor wafer is much smaller when the bubbles are in the groove than when out of the groove. Accordingly, even when the bubbles expand by being heated during a following process, the bubbles will cause the wafer to be little deformed since the bubbles exert stress on the wafer through only small areas. The wafer will not be peeled off the reinforcing plate even when ultrasonic vibrations are applied during a following rinsing step or a wet etching step. Further, even when etching liquid enters the bubbles, a contaminated area of a device-forming face is small, since the contact area is small between the bubbles and the wafer.

BRIEF DESCRIPTION OF THE DRAWINGS

The foregoing and other objects, features and advantages of the invention, as well as a presently preferred embodiment thereof, will become more apparent from a reading of the following description in connection with the accompanying drawings in which:

FIG. 2 shows application of a hot-melt adhesive to a reinforcing plate;

FIG. 3 shows placing a semiconductor wafer and applying a load on it;

FIG. 4 shows deaerating a hot-melt adhesive in a vacuum vessel;

FIG. 5 shows hardening of a hot-melt adhesive in a vacuum vessel;

FIG. 6 is a cross sectional drawing of an entire assembly of the wafer, adhesive and reinforcing plate;

FIG. 7 is a partial cross sectional drawing of an entire assembly of the wafer, adhesive and reinforcing plate;

FIG. 8 is a cross sectional drawing of an entire assembly of the wafer, adhesive and reinforcing plate;

FIG. 9 is a partial cross sectional drawing of an entire assembly of the wafer, adhesive and reinforcing plate;

DESCRIPTION OF THE PREFERRED EMBODIMENT

Figure 1:
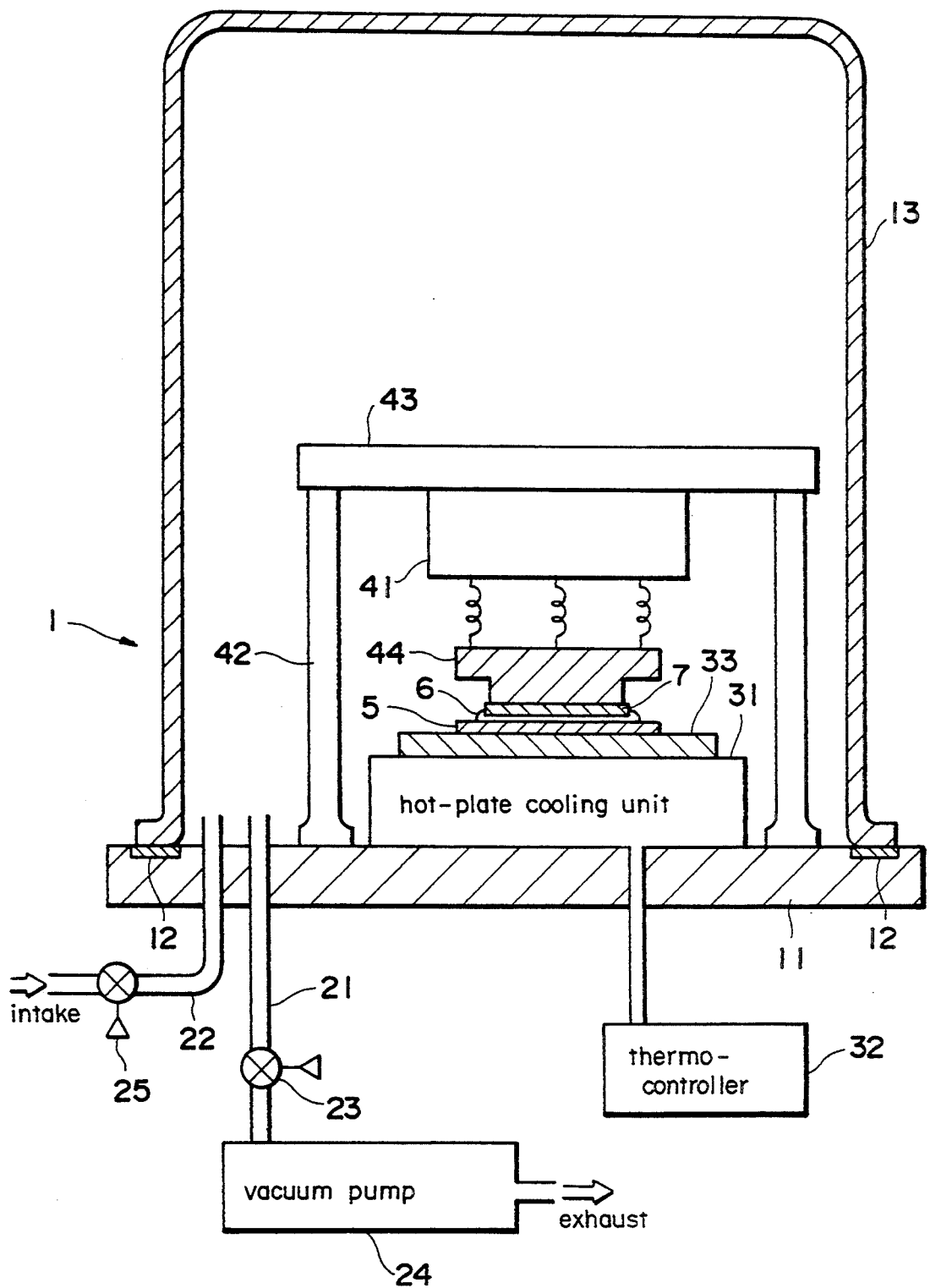
FIG. 1 is a cross sectional view of a vacuum apparatus to be used when a reinforcing plate and a semiconductor wafer are adhered together according to a process of the present invention.
Figure 2:
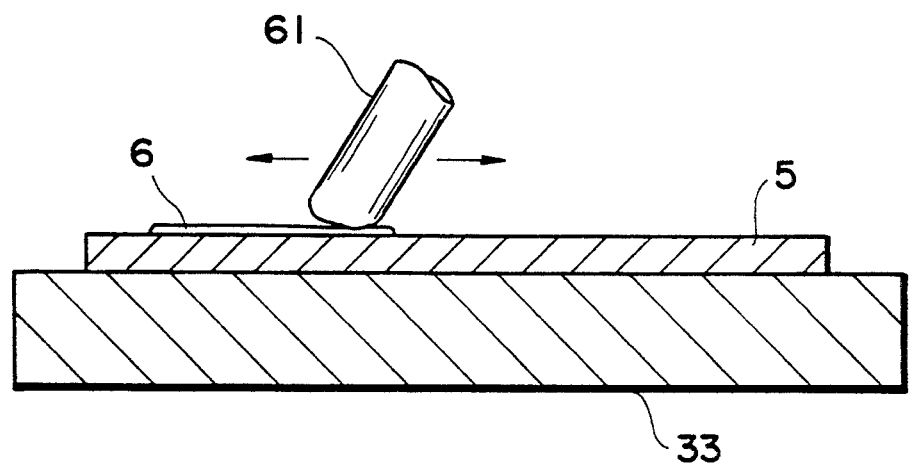
FIGS. 2 to 5 show reinforcing processes related to embodiments of the present invention.
Figure 3:
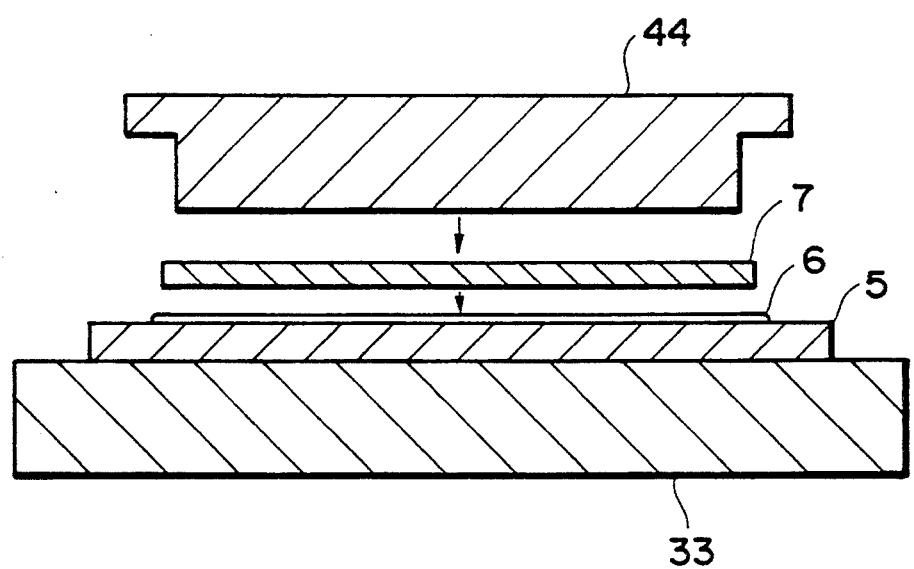
Figure 4:
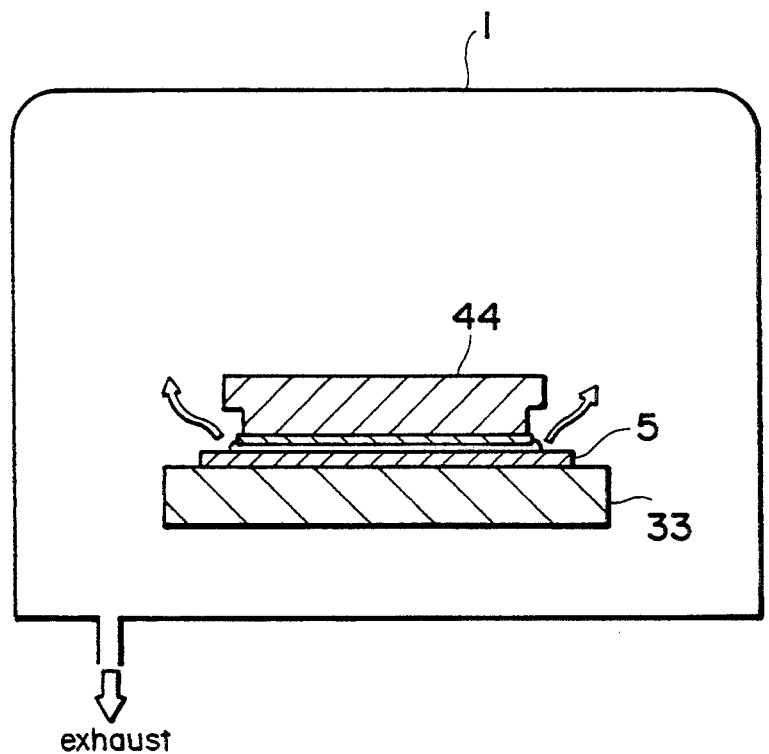
Figure 5:
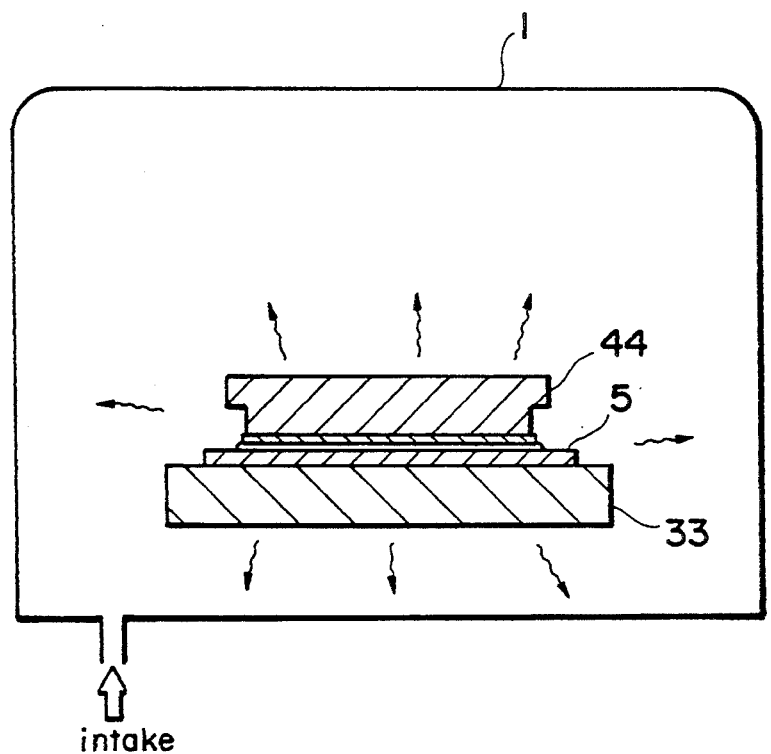
Figure 6:
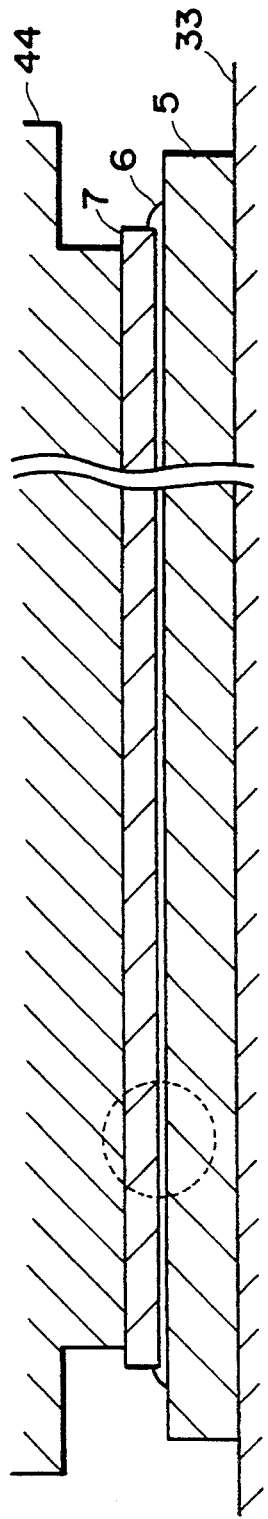
FIGS. 6 and 7, each shows a reinforced semiconductor wafer without a groove on a reinforcing plate.

Referring to FIG. 1, a vacuum apparatus to be used for a reinforcing process according to the present invention is described. A rubber seal ring 12 is filled in a groove formed on an upper face of a base plate 11 where a glass bell jar 13 is placed, and a vacuum vessel or chamber 1 is thereby formed. Pipes 21 and 22 go through the base plate 11, and the pipe 21 is connected with a vacuum pump 24 through a valve 23. The pipe 22 is vented to the atmosphere through a valve 25. Accordingly, if the valve 23 is opened, a pressure is lowered inside the chamber 1, and if the valve 25 is opened, the pressure increases inside the chamber 1. A rotary pump which can evacuate to a 10 mm Hg or the like, is used as a vacuum pump 24.

A hot-plate cooling unit 31 is placed on a base plate 11. The hot-plate cooling unit has a built-in pipe line for cooling (not shown in the drawing). A hot plate 33 has a built-in heater. The hot plate is placed on the hot-plate cooling unit 31. Cooling and heating by the hot-plate cooling unit 31 and the hot plate 33 are controlled by a thermocontroller 32 which is installed outside the chamber 1. A suspending device 41 supported with a column 42 disposed on the base plate 11 and a supporting bar 43 supported with the column 42, suspends a weight 44. A reinforced semiconductor wafer can receive an even load regardless of its location due to the suspending device 41. A reinforced semiconductor wafer, which is constituted by a reinforcing plate 5 and a semiconductor wafer 7 adhered together using a hot-melt adhesive 6 is placed between the hot plate 33 and the weight 44.

Referring to FIG. 1, if a robot is installed in a chamber 1 which can set a semiconductor wafer 7 automatically, a low pressure ambient pressure can be established in the chamber 1 at a prior step to making a reinforcing plate 5 adhere to the wafer 7. In that event, the remaining bubbles can be sufficiently reduced in a hardened hot-melt adhesive, since the hot-melt adhesive 6 can be exposed in a vacuum or a sufficiently low pressure ambient pressure to remove volatile elements before a wafer 7 is placed on the adhesive and then the wafer 7 is placed to adhere to the plate 5, and a deaeration treatment can be conducted.

Next referring to FIGS. 2 to 5, a reinforcing process is described in these embodiments, where neither the hot-plate cooling unit nor the suspending device is used.

First of all, a hot plate 33 is heated and a reinforcing plate 5 is placed there on. Thereafter, a rod 61 made of electronwax (Proof AH20 of NIKKA SEIKOH CO., LTD. ), as a hardened hot-melt adhesive wax material, is rubbed on the heated reinforcing plate 5. In the foregoing process, the liquified wax 6 is applied to the reinforcing plate 5 (shown in FIG. 2) and a wafer 7 is adhered, to the reinforcing plate 5. Thereafter, a weight 44 of several hundred grams is placed on a wafer 7 to put a load on the wafer 7 (shown in FIG. 3). The wafer 7 is placed in the chamber 1 bearing the weight 44 as the hot plate 33 is heated, and then a vacuum is established to 10 mm Hg in the chamber by a rotary pump. Bubbles are then generated from the wax 6, the bubble then burst one after another (shown in FIG. 4). It is confirmed that the process of bubbles being generated and bursting is finished, that is to say, evaporation of volatile elements is completed. Thereafter, a valve is controlled to raise the chamber pressure to 100 mm Hg then the valve is shut to maintain the vacuum. Thereafter, heating of the hot plate 33 is stopped, and the hot plate is permitted to naturally cool. The chamber 1 is returned to atmospheric pressure by opening the valve when the wax 6 is completely hardened, then the wafer 7 is taken out. This process enables the wafer 7 to adhere well to the reinforcing plate 5 where no bubbles remain in the hardened wax 6 (i.e., hot-melt adhesive).

Here, a semiconductor wafer 7 was made of InP Indium Phosphorous with a gold vaporizing plate on its adhering face (20 mm×30 mm×350 μm (thickness)), and a reinforcing plate 5 was made of borosilicate glass which has the same thermal expansion coefficient as InP. A hot-melt type electronwax (Proof AH20 of NIKKA SEIKOH CO., LTD.) with a softening point of 136° C. was used as a wax 6. Therefore, a hot plate 33 was heated to 150°–170° C. when a vacuum was established for deaeration.

A reinforced semiconductor wafer 7 was an InP wafer for making a light-emitting diode (LED) of a face luminescence type in this embodiment, where a plurality of LEDs were integrated on the wafer 7 in a process prior to the reinforcing process. That is to say, a plurality of epitaxial crystal layers belonging to InP are placed on top of each other on a face of the InP wafer which is sliced off from an ingot of single crystal InP into a plate and mirror-finished. The face is formed to have an LED construction of a pn junction type. The LED-formed face is adhered with a wax 6 to a reinforcing plate 5. The InP wafer reinforced by the method of this embodiment is ground from a side of the wafer 7 other than the LED-formed face, so as to be made thinner. Thereafter, a necessary step such as electrode forming, etc., is performed on the ground face, and the wafer is made into chips of each LED unit by dicing. A ball lens is mounted on a face of the LED chip other than a LED-formed face before the chip is shipped as a product. Here, if the thickness of a ground wafer 7 partially varies from place to place, the chips which are separated from the wafer 7 by dicing will have different thicknesses, and consequently a spot location of a light focused by a ball lens from a LED luminescence face varies from chip to chip. According to this embodiment, chips could be made thin and of even thickness with a very high precision, since the number of bubbles was minimized. Accordingly, a luminescent element with a ball lens made by a process of the embodiment has a very high reliability.

An internal pressure (gas pressure) of a bubble generated during a deaeration step under a vacuum is balanced with a surface tension of a film forming the bubble (wax 6 in the embodiment) and an external pressure (gas pressure). Accordingly, the internal pressure of the generated bubble is almost the same as that in the vacuum vessel. If volatile elements are totally eliminated from the wax, no more gases are generated from the wax under the pressure.

When a pressure in a vacuum vessel is raised before a step of cooling and hardening, a bubble volume is reduced since the volume is inversely proportional to a rise of an internal pressure of the vacuum vessel, so that the internal bubble pressure is balanced with that of the external. For example, the bubble volume becomes one tenth its original volume when the pressure is raised ten times higher. Here, since volatile elements in a wax are mostly eliminated during a deaeration treatment, a portion of the gases in the bubble is absorbed by the wax again. In addition, since the ambient pressure is raised, a load due to the gas pressure is applied on the wafer. Assuming that a vacuum pressure is about 10 mm Hg and is raised to 100 mm Hg before a step of cooling and hardening, a load of about 130 g/cm$^2$ is applied on the wafer. The load causes the contact between the wafer and the reinforcing plate to be strengthened, and consequently it is more difficult for bubbles to be generated.

As mentioned above, where a wafer is adhered to a reinforcing plate, a vacuum is established to eliminate air or volatile elements in a wax, thereafter the pressure is raised higher although still near a vacuum, the raised pressure vacuum is maintained, and just after that step a cooling step is started to harden the wax, bubbles which used to remain in a hardened wax according to a conventional adhering method disappear or their sizes become very small if at all, since the internal pressure of the bubbles is approximately a vacuum, and the bubbles cause little trouble in any following steps.

The lower a vacuum pressure during deaeration is, the better, to eliminate air or volatile elements in a wax. However, as a higher vacuum is attempted, it takes longer to establish the vacuum, and a vacuum pump cost will be higher. Accordingly, an appropriate vacuum level should be adopted. In the aforementioned embodiment, a vacuum of 10 mm Hg was established because the level was limited by the performance of the rotary pump, but actually about twice this margin is preferable. Accordingly, a vacuum pressure of 20 mm Hg or lower is preferred during deaeration after a vacuum is established.

On the other hand, a pressure for a cooling-hardening step is preferably as high as possible compared with that for deaeration by a vacuum in a chamber, so that bubbles with an internal pressure of almost a vacuum are reduced in size, and more preferably the bubbles themselves disappear. In order for bubbles sufficiently to be diminished, or to even disappear, a pressure for cooling-hardening should be three or five times higher, and preferably about ten times higher, than that for deaeration by an established vacuum. An absolute value of pressure for hardening is preferred to be as low as possible, lower than one third or one fifth of the atmospheric pressure, since re-absorption of air or volatile elements into the wax can occur to a small degree. Accordingly, a pressure in the chamber is preferably from 60 mm Hg to 160 mm Hg (or 250 mm Hg) during the cooling-hardening step. However, if a process implemented on a wafer after reinforcing does not include a vapor deposition treatment or the like, a cooling step may be under a relatively high pressure such as atmospheric pressure or the like.

A period of time for cooling-hardening is preferably as short as one tenth or less that for deaeration. If a period of time for coolings hardening of a wax is sufficiently shorter than that for eliminating air or volatile elements from a wax, an amount of air or volatile elements re-absorbed into the wax can be greatly reduced. This suppresses generation of vacuum cavities and enables production of a better product. In the event, however, that a release of the re-absorbed air or volatile elements will not cause any difficulty in a following process, a hardening time of a hot-melt type wax may be one tenth or more.

Actually, when adherence is implemented according to the present invention, an appropriate method is selected meeting limiting conditions in the apparatuses used or in the steps chosen from among the above conditions.

As mentioned above, vacuum bubbles remaining between a wafer and a reinforcing plate can be eliminated which used to be difficult to remove, by implementing an operation that when adhering a wafer to a reinforcing plate, volatile elements are eliminated by establishing a vacuum while keeping a wax heated, and just thereafter the pressure is raised higher than that for the established vacuum or for deaeration. Accordingly, a deterioration of grinding accuracy (especially in evenness of thickness), or peeling off or breaking of a wafer due to the effects of bubbles, can be avoided during processing the wafer. This enables attainment of an improved precision and a better yield during a manufacturing process of a semiconductor wafer or a semiconductor device. Especially, in case that bubbles can be easily generated due to irregularities on a surface of a wafer, for example in processing a wafer in course of manufacturing a semiconductor element such as an LED and the like, it is especially easy for a bubble to remain inside which leads to breaking of the wafer due to stress, and an effect of diminishing any remaining bubbles is remarkable.

In the above embodiment, deaeration is conducted by establishing a vacuum after a wafer and a reinforcing plate are adhered together, and then the pressure is raised and hardening is conducted. However, it may also be acceptable that a wax is heated keeping a wafer and a reinforcing plate separate without adhering, volatile elements and air are eliminated by establishing a vacuum, then the wafer is adhered to the reinforcing plate, deaeration is conducted for a predetermined period of time, and thereafter the hot-melt adhesive is hardened with an elevated pressure. In embodiments shown in FIGS. 2 to 5, a weight is set on a wafer manually by an operator to put a load on the wafer for firm adherence, but it is acceptable to use an apparatus which enables varying a load optionally, or using an apparatus in which these devices including a vacuum vessel are integrated into one unit. Further, even if a combination of a wafer and a reinforcing plate is placed upside down, the effect that comes from implementation of a deaeration treatment and hardening treatment in different ambient pressures does not vary.

Figure 7:
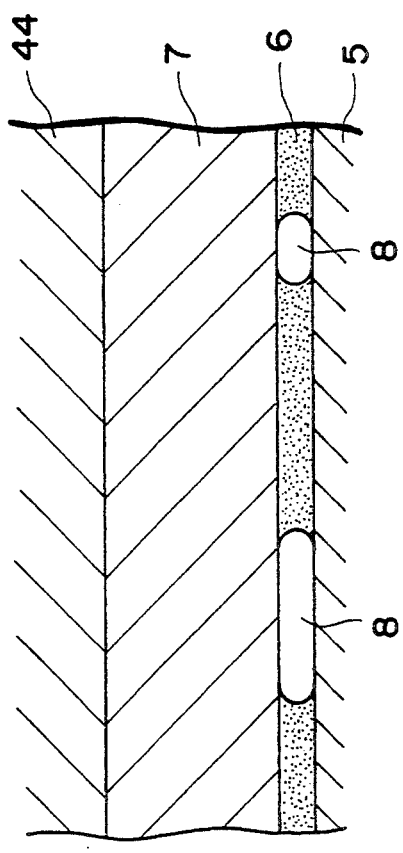

In order to get a greater effect in the present invention, it is preferable to form a fine groove on an adhering face of a reinforcing plate 5. FIGS. 6 and 7, and FIGS. 8 and 9 describe this by a comparison. Bubbles 8 in a wax 6 (hot-melt adhesive) between a reinforcing plate 5 and a wafer 7 are like a thin disk without a groove on the reinforcing plate 5 as shown in FIG. 7. In this event, complete deaeration takes a relatively long time since bubbles 8 do not move easily due to viscosity of the liquid wax 6 (adhesive) in a narrow gap (about 10 $\mu$m) in an area between a reinforcing plate 5 and a wafer 7. Additionally, when the adhesive 6 is hardened in the arrangement shown in FIG. 7, a contact area between the bubbles 8 and a wafer 7 becomes relatively large, which may cause the wafer 7 to bulge due to an expansion of the bubbles 8, and may also cause the wafer 7 to be damaged in an extended area due to contaminants such as an etching liquid entering the bubbles 8.

Figure 8:
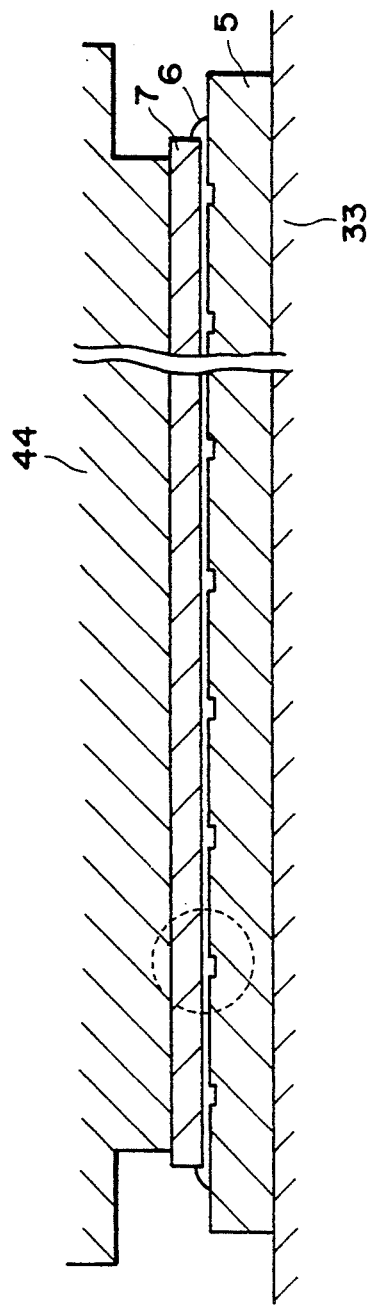
FIG. 8 and FIG. 9 show a reinforced semiconductor wafer with a groove on a reinforcing plate.
Figure 9:
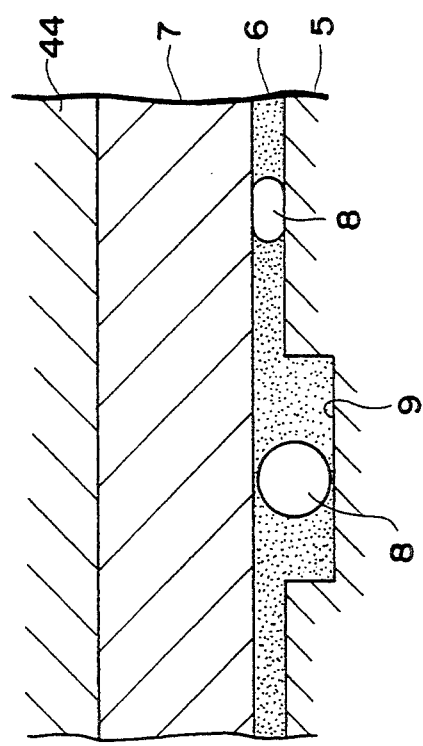

On the contrary, there are advantages as follows where a plurality of grooves 9 are formed on a adhering face of a reinforcing plate 5 as shown in FIGS. 8 and 9. First, bubbles 8 accumulate together in the grooves 9 and easily move during a deaeration treatment. This allows the period of time for a deaeration treatment to be shortened and furthermore the number of remaining bubbles is reduced. Second, even if the adhesive 7 is hardened such that it includes bubbles 8 there in, since the bubbles 8 can be spherical in the grooves 9, contact areas with the wafer 7 will be small. Therefore, the wafer 7 is deformed only slightly if at all when the bubbles 8 are expanded, and the wafer 7 is damaged, only slightly if at all when contaminants enter the bubbles 8. Even when ultrasonic vibrations are applied, the wafer 7 is not peeled off from the reinforcing plate 5. Further, since most of the bubbles 8 remain in the grooves 9, the other part of the wafer 7 is damaged very little if at all.

Figure 10:
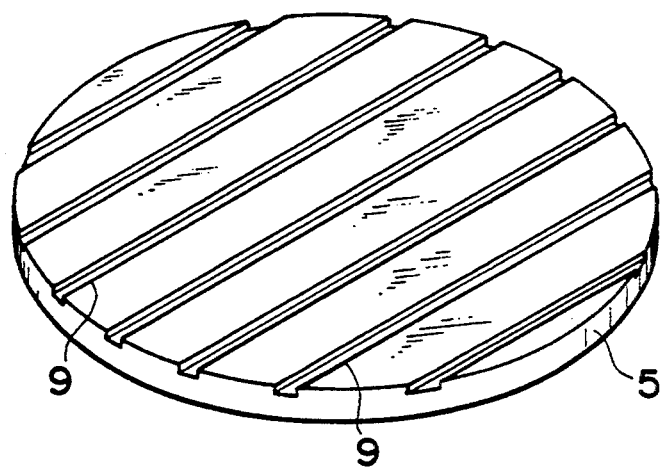
FIGS. 10 to 13 show reinforcing plates used for embodiments of the present invention, and are perspective views having different types of grooves, respectively.
Figure 11:
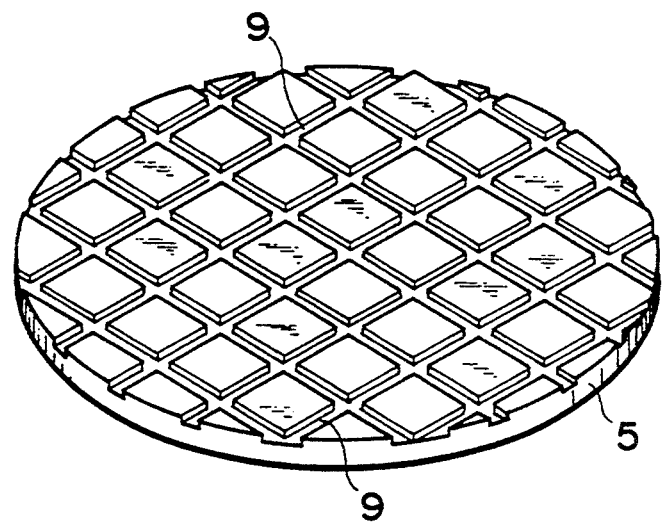
Figure 12:
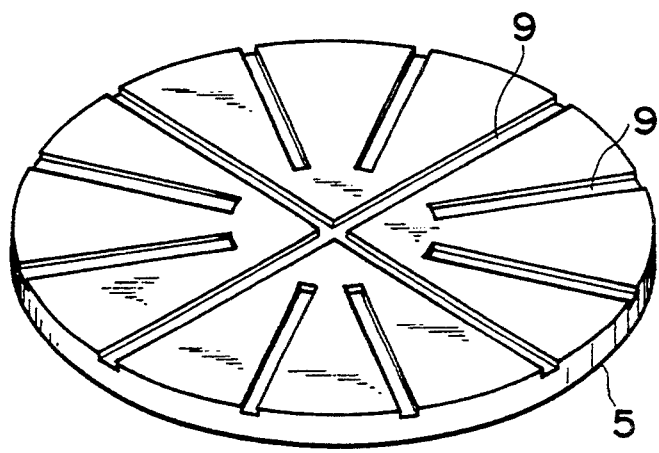
Figure 13:
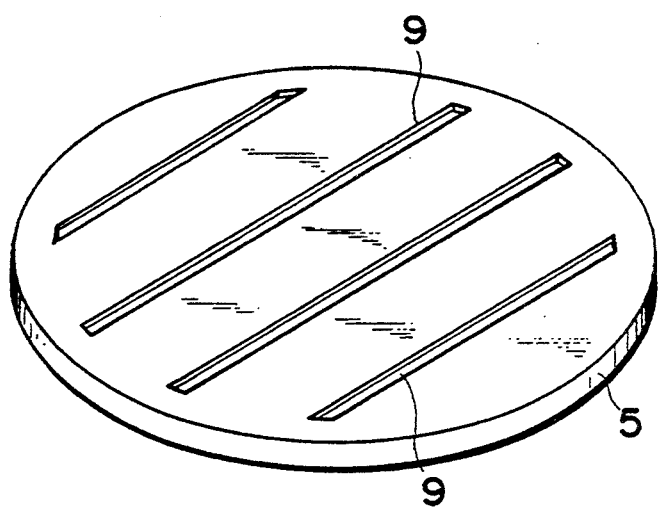

Some examples of a reinforcing plate 5 with such a groove 9 are shown in perspective views in FIGS. 10 to 13. The grooves 9 may be formed as a plurality of parallel grooves 9 as shown in FIG. 10. The grooves 9 may alternatively be formed as a plurality of orthogonal grooves 9 as shown in FIG. 11. The grooves 9 may, in another arrangement, be formed as a plurality of radial grooves 9 extending from a center as shown in FIG. 12. The grooves 9 also may be formed as a plurality of grooves 9 which do not reach an edge of a reinforcing plate 5, as shown in FIG. 13. In case of FIG. 13, the grooves 9 are not exposed outside of an adhering face of the wafer 7 and the reinforcing plate 5.

Figure 14:
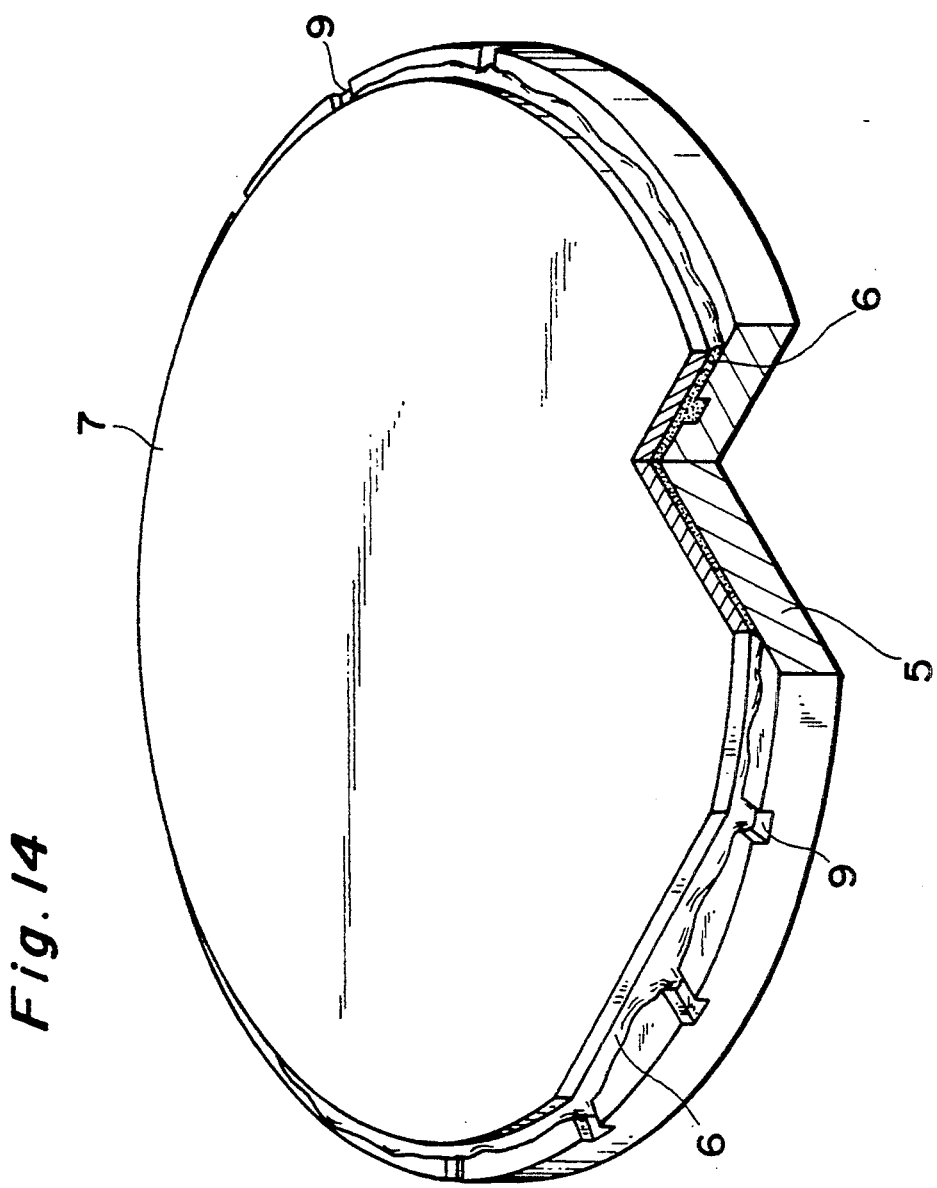
FIG. 14 is a perspective view showing a reinforced semiconductor wafer of one of the embodiments of the present invention, a part of which is shown in cross-section.

FIG. 14 shows a wafer where a wafer 7 such as InP is adhered on to a reinforcing plate 5 with a plurality of parallel grooves 9 formed on a face thereof. There is a hardened hot-melt adhesive 6 between the wafer 7 and the reinforcing plate 5. The semiconductor wafer 7 is reinforced with the reinforcing plate 5, and only a face to be worked of the wafer 7, namely only a bottom side thereof, is exposed.

Some embodiments of the present invention with grooves on a reinforcing plate 5 are described here with reference to FIGS. 2 to 5. A glass plate 5 as a reinforcing plate has grooves of several tens of micra ($\mu$m) depth and several hundreds of micra ($\mu$m) width with 10 mm intervals formed thereon. No grooves are illustrated in FIGS. 2 to 5, but in the following it is supposed that some grooves are formed on a reinforcing plate.

First of all, a hot plate 33 is heated and a glass plate 5 is placed thereon with a groove-formed side facing upward. A wax 6 as a hot-melt adhesive is applied on the glass plate 5 (see FIG. 2), and then a wafer 7 as a semiconductor wafer is placed and pressed On the groove-formed face of the glass plate 5 so they adhere together. Next, a weight 44 of several hundreds grams is put on the wafer 7 (see FIG. 3). While keeping the hot plate 33 heated, the whole assembly is placed in a vacuum vessel and a vacuum is established to about 10 mm Hg by a rotary pump. The vacuum condition is maintained until evaporation of volatile elements is completed from the wax 6 (see FIG. 4). Thereafter, the hot plate 33 is cooled down, the vacuum is broken in the vacuum vessel after the wax 6 being completely hardened, and then the reinforced wafer is taken out. This process results in a good adherence with a slight amount of bubbles only along the grooves on the glass plate 5. Here, the wafer 7 was formed using InP with gold plating by evaporation deposit on a adhering face was (30 mm $\times$ 40 mm $\times$ 350 $\mu$m (depth)), and a reinforcing plate was made of a borosilicate glass plate 5 which has the same thermal expansion coefficient as that of InP. A hot-melt type resin (Proof AH20 of NIKKA SEIKOH CO., LTD.) with a softening point of 136° C. was used as a wax 6. Therefore, a hot plate 33 is heated to 150°–170° C. when establishing a vacuum.

Bubbles generated during a deaeration treatment under a vacuum were pushed out of an adhering face by applying a load on a wafer 7. In this case, where grooves 7 of several hundreds of micra ($\mu$m) width and several tens of micra ($\mu$m) in depth with 10 mm intervals were formed vertically and horizontally in advance on a glass plate 5, the bubbles were pushed out along the groove and did not widely spread on the adhering face. The bubbles were pushed out more smoothly than where there were no grooves, since the bubbles could move along the grooves. Additionally, even if some bubbles, remained in the adhering face, a distribution of the remaining bubbles was in lines because the bubbles lay along the grooves. Accordingly, since a floating area of the wafer over the bubbles on the glass plate 5 was small, no wafer 7 was peeled Off due to ultrasonic vibrations or heating under a vacuum, and the adhering face of the wafer 7 was neither contaminated nor broken due to entry of the etching liquid into the bubbles.

A depth and width of a groove formed on a glass plate 5 should be such as to which sufficiently enable the groove to accommodate bubbles. For example, when a distance between a wafer 7 and a glass plate 5 to be adhered is about 10 $\mu$m and generated bubbles 8 are 10 mm $\times$ 10 mm or the like which means a total volume of bubbles 8 is 1 cubic millimeter, about 6 grooves 20 $\mu$m deep and 300 $\mu$m wide are necessary to be formed on the adhering face where the wafer 7 is 30 mm $\times$ 30 mm in size. Actually six grooves 10 μm deep and 100 μm wide are sufficient, because bubbles are pushed out of the adhering face more easily with the grooves than without the grooves. The number and interval of grooves are determined by considering a situation of bubble generation and a possible width and depth of a groove to be formed, and optimum conditions should be selected. Chemical etching or physical chemistry etching is preferable for forming a groove, since a glass plate 5 is easy to break due to shock or heat if physical machining with a diamond blade or the like is used to form the groove.

As mentioned above, bubbles with an inner pressure of almost vacuum can be removed only by using a reinforcing plate with a groove on its adhering face when a wafer 7 is adhered to a glass plate 5 and a vacuum is established to eliminate volatile elements from the adhesive. Besides, even if some bubbles remain, their size and distribution can be such that a following wafer working step is not adversely affected. Accordingly, a grinding precision can be maintained or a wafer 7 can be prevented from being peeled off or broken during wafer processing due to including bubbles.

From the foregoing description it will be apparent that the present invention provides an improved process for reinforcing a semiconductor wafer and an improved reinforced semiconductor wafer. Variations and modifications in the herein described process and semiconductor wafer, within the scope of the invention, will undoubtedly suggest-themselves to those skilled in the art. Accordingly, the foregoing description should be taken as illustrative and not in a limiting sense.

What is claimed is:

1. A process for reinforcing a semiconductor wafer, comprising:
   a first step of enforcing said semiconductor wafer by adhering one face of said semiconductor wafer to a reinforcing member having a flat face using a hot-melt adhesive which is softened by heating, and pressurizing the other face of such semiconductor wafer with a weight which produces a load thereon;
   a second step of deaerating said hot-melt adhesive by exposing said reinforced semiconductor wafer to a lower ambient pressure than atmospheric pressure for a predetermined period of time while said hot-melt adhesive remains softened;
   a third step of increasing the lower ambient pressure to a second pressure greater than the lower ambient pressure but less than atmospheric pressure; and
   a fourth step of hardening said hot-melt adhesive by cooling said reinforced semiconductor wafer while maintaining said second pressure of said third step.

2. A process for reinforcing a semiconductor wafer as recited in claim 1, further comprising a step of forming a groove in said flat face of said reinforcing member such that said groove extends to an outside edge of said one face.

3. A process for reinforcing a semiconductor wafer as recited in claim 1, wherein said first step is performed under atmospheric pressure.

4. A process for reinforcing a semiconductor wafer as recited in claim 1, wherein said first step is performed under a lower pressure than atmospheric pressure.

5. A process for reinforcing a semiconductor wafer as recited in claim 1, wherein in said second step, said hot-melt adhesive is deaerating at a pressure which is lower than one fifth of the pressure maintained in said fourth step.

6. A process for reinforcing a semiconductor wafer as recited in claim 1, wherein in said second step, said hot-melt adhesive is deaerating at a pressure which is lower than one tenth of the pressure maintained in said fourth step.

7. A process for reinforcing a semiconductor wafer as recited in claim 1, wherein in said second step, said hot-melt adhesive is deaerating at a pressure which is lower than 20 mm Hg.

8. A process for reinforcing a semiconductor wafer as recited in claim 1, wherein in said fourth step, said hot-melt adhesive is hardened at a pressure which is 60–250 mm Hg.

9. A process for reinforcing a semiconductor wafer as recited in claim 1, wherein in said fourth step, said hot-melt adhesive is hardened for a period of time which is shorter than one tenth of said predetermined period of time for deaerating said hot-melt adhesive in said second step.

10. A process for reinforcing a semiconductor wafer as recited in claim 1, wherein a material constituting said reinforcing member has a thermal expansion coefficient which is approximately the same as that of said semiconductor wafer material.

11. A process for reinforcing a semiconductor wafer as recited in claim 10, wherein said reinforcing member comprises borosilicate glass and said semiconductor wafer comprises Indium Phosphorous.

12. A process for reinforcing a semi-conductor wafer as recited in claim 1, wherein said lower ambient pressure of said second step is less than or equal to 10 mm Hg and said higher pressure of said third step is in the range of 60 to 160 mm Hg.

* * * * *